United States Patent
Wolff et al.

(10) Patent No.: US 6,618,605 B1
(45) Date of Patent: Sep. 9, 2003

(54) METHOD AND APPARATUS FOR MR PERFUSION IMAGE ACQUISITION USING A NOTCHED RF SATURATION PULSE

(75) Inventors: Steven D. Wolff, New York, NY (US); Glenn S. Slavin, Rockville, MD (US); Thomas K. F. Foo, Rockville, MD (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/391,965

(22) Filed: Sep. 8, 1999

(51) Int. Cl.[7] .............................................. A61B 5/055
(52) U.S. Cl. ..................... 600/410; 324/306; 324/307; 324/309; 600/419
(58) Field of Search ................................. 600/410, 413, 600/419; 324/306, 307, 309, 314

(56) References Cited

U.S. PATENT DOCUMENTS

| | | | |
|---|---|---|---|
| 4,715,383 A | | 12/1987 | Ehman et al. |
| RE32,748 E | * | 9/1988 | Ordidge et al. ............. 324/309 |
| 5,054,489 A | * | 10/1991 | Axel et al. .................. 600/419 |
| 5,492,124 A | * | 2/1996 | Purdy ........................ 600/413 |
| 5,821,752 A | * | 10/1998 | LeRoux ...................... 324/314 |
| 5,908,386 A | | 6/1999 | Ugurbil et al. ............. 600/410 |
| 6,078,175 A | * | 6/2000 | Foo ............................ 324/306 |
| 6,137,290 A | * | 10/2000 | Hurd et al. ................. 324/307 |

FOREIGN PATENT DOCUMENTS

| | | |
|---|---|---|
| JP | 03 149031 | 6/1991 |
| JP | 05 076516 | 3/1993 |

* cited by examiner

*Primary Examiner*—Ruth S. Smith
(74) *Attorney, Agent, or Firm*—Ziolkowski Patent Solutions Group, LLC; Michael A. Della Penna; Carl B. Horton

(57) ABSTRACT

A method and apparatus is disclosed for MR perfusion acquisition using a notched RF saturation pulse. In acquiring such MR data, a volume of slice locations is selected in which MR data is to be acquired. Each given slice is prepared with a notched RF saturation pulse which has a stop-band between a pair of pass-bands. The stop-band is designed to not affect the spins in the next slice in which MR data is to be acquired thereby effectively increasing the TI and increasing SNR and contrast simultaneously. Since the notched saturation pulse saturates all the spins outside of the notched stop-band, the blood in the ventricular chamber is effectively saturated so that the resulting perfusion images have blood pool suppression. Additionally, the use of a 90° presaturation RF pulse provides a high level of immunity to the effects of arrhythmias or other variations in the patient's heart rate. In order to keep the stop-band, or the notch, as wide as possible to overlap the boundaries of each slice location, it is preferable to interleave the acquisition of slice locations.

26 Claims, 4 Drawing Sheets

METHOD AND APPARATUS FOR MR PERFUSION IMAGE ACQUISITION USING A NOTCHED RF SATURATION PULSE

BACKGROUND OF THE INVENTION

The present invention relates generally to magnetic resonance imaging (MRI), and more particularly to, a method and apparatus to acquire MR images with improved image signal and contrast using an interleaved, notched RF saturation pulse as applied to MRI perfusion imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Myocardial perfusion imaging is the detection of a contrast agent as it passes through the muscle tissue in the heart to non-invasively study blood flow in the micro-circulation of the heart. Typically, perfusion imaging consists of using an injected contrast agent (bolus) with rapid imaging during the first pass of the bolus using carefully optimized pulse sequence parameters. Quantification of blood flow from these images is accomplished with a region-of-interest based signal, time-intensity curve analysis. To avoid cardiac motion artifacts, the perfusion images are typically acquired with ECG gating to synchronize the repeated acquisition of images at different spatial locations, each to the same relative point in the cardiac cycle. In the past, the period of image acquisition was typically several minutes long, causing the images to suffer from significant respiratory motion artifacts. Such artifacts would require the manual registration and analysis of the perfusion images which is cumbersome and time-consuming because the user must carefully arrange each image to compensate for the respiratory motion before proceeding to a region-of-interest, time-intensity analysis. Furthermore, the passage of the contrast agent takes place over a temporal span of several seconds. By averaging over several seconds or minutes, the effectiveness of measuring any change in perfusion is severely compromised.

The goal of myocardial perfusion imaging is to detect and characterize the abnormal distribution of myocardial blood flow. The ability to extract quantitative perfusion indices such as time-to-peak, contrast enhancement ratio, and the slope from the first-pass contrast-enhanced MR images requires a generation of myocardial and blood-pool time-intensity curves for desired regions-of-interest. The computation of these curves is complicated when patients do not suspend respiration adequately, which then results in an image misregistration over time. Mis-registration artifacts occur frequently due to the fact that the breath-hold duration required to capture first-pass kinetics is typically 20–30 seconds. An accurate spatial alignment of images over a period of time is necessary for creating representative and accurate time-intensity curves for a given region of the myocardium.

The imaging of blood perfusion in tissue is closely related to the imaging of blood flow in vascular structures, such as in MR angiography. As with MR angiography, MR perfusion imaging is performed by injecting the bolus of an MR active contrast agent into the patient during an imaging session. These agents can either decrease the $T_1$ of blood to enhance the detected MR signal, or decrease the $T_2$ of blood to attenuate the detected MR signal. As the bolus passes through the body, the enhanced or attenuated signal increases or decreases the signal intensity observed in perfused tissue, but not in non-perfused tissue. The degree of signal change in the observed tissue can be used to determine the degree of tissue perfusion. Since perfusion measurements are based on the strength of the MR signals acquired during the scan, it is important that the MR signal strength be made insensitive to other measured variables. One such variable is the magnitude of the longitudinal magnetization $M_2$, which is tipped into the transverse plane by the RF excitation pulse in the MR pulse sequence. After each such excitation, the longitudinal magnetization is reduced and then recovers magnitude at a rate determined by the $T_1$ constant of the particular spins being imaged. If another pulse sequence is performed before the longitudinal magnetization has recovered, the magnitude of the acquired MR signal will be less than the signal produced by a pulse sequence which is delayed long enough to allow full recovery of the longitudinal magnetization. It is therefore important in perfusion imaging that the longitudinal magnetization variable be maintained at a constant level throughout the scan.

When cardiac gating is used to control the acquisition of MR perfusion image data, the time interval between acquisitions can vary considerably with a consequent variation in the longitudinal magnetization. This is particularly true if the subject has an irregular heartbeat (arrhythmia) or other variations in the heart rate. One solution to this problem is to apply an RF saturation pulse to the subject just prior to each image acquisition pulse sequence, or imaging pulse sequence segment, for each slice, and allow a fixed recovery time (TI) to occur before performing the pulse sequence. Unfortunately, unless the recovery time TI is fairly lengthy, the resulting MR signals will not have significant contrast between tissues of differing $T_1$ relaxation times, in addition to the MR signal being small, with a consequent reduction in the acquired MR signals, signal-to-noise ratio (SNR), and contrast-to-noise ratio (CNR). However, lengthening the recovery period TI lengthens the time required to perform each pulse sequence segment and reduces the number of slice locations that can be acquired during a cardiac R-R interval. Therefore, there is a direct tradeoff between image quality and the number of locations that can be acquired in a single breath-hold scan.

One particular method includes preparing a given slice with a non-selective 45–60° pulse which is allowed to recover for a time TI, then acquire data with an echo planar imaging (EPI) readout. However, with this implementation, the 45–60° preparation pulse provides only weak $T_1$ weighting and can allow signal variation due to variations in the patient's cardiac interval arrhythmias. Further, the short TI (approximately 10 ms) does not allow development of sufficient image SNR or contrast. In other words, the low preparation flip angle of 45–60° does not allow for the development of adequate contrast and such a low excitation flip angle does not provide adequate SNR. Replacing the short TI partial-saturation preparation sequence with a long TI saturation-recovery sequence would address this one problem, but causes another by reducing slice coverage.

It would thus be desirable to have a means for acquiring MR perfusion images that does not affect the slice that is to be immediately acquired so as to obtain longer TI times, while maintaining the ability to acquire multiple slices per R-R interval, provide a high degree of immunity to the effects of arrhythmias and other variations in a patient's heart rate, and offer blood pool suppression (to better delineate the myocardial tissue).

SUMMARY OF THE INVENTION

The present invention relates to a system and method of acquiring MR data using an interleaved, notched RF saturation pulse that provides adequate slice coverage, good overall SNR, and sufficient contrast between enhanced and unenhanced myocardium in myocardial perfusion imaging, overcoming the aforementioned problems.

Rather than using a non-selective partial-saturation pulse, the present invention uses a volume-selective RF saturation pulse with a stop-band, or "notched," sliced profile. The notch is designed to coincide with the slice location that will be imaged by a following data acquisition. Preferably, the width of the notch is user selectable and slightly greater than the imaged slice thickness (to account for cardiac or respiratory motion during the TI time). In MR perfusion studies, the notched pulse saturates all the spins outside of the notched stop-band. This results in the saturation of the blood in the ventricular chambers and provides a high degree of immunity to the effects caused by arrhythmias or other variations in the patient's heart rate. The notched saturation pulse does not affect the slice to be immediately acquired after the transmission of the pulse so longer TI times are attainable while maintaining the ability to obtain at least 3–4 slices per R-R interval.

In accordance with one aspect of the invention, a method of acquiring MR data includes the steps of selecting a volume of slice locations in which MR data is to be acquired, transmitting a notched RF saturation pulse within the selected volume of slice locations, wherein the notched RF saturation pulse has a stop-band situated between a pair of pass-bands, and then acquiring MR data for the slice location that was in the stop-band of the notched RF saturation pulse previously transmitted.

In accordance with another aspect of the invention, a method of acquiring MR data with longer relaxation time (TI) includes the steps of defining a number of slices in a volume of interest for which acquisition of MR data is desired, then transmitting a notched RF saturation pulse designed to saturate a next slice and all surrounding tissue in the volume of interest except a current slice, and acquiring MR data from the current slice. The process repeats the transmission and acquisition steps for each successive slice in the volume of interest wherein the next slice becomes the current slice and another slice becomes the next slice.

In accordance with yet another aspect of the invention, a computer system is disclosed for use with an MRI apparatus having a computer programmed with a computer readable storage medium having thereon a computer program programmed to select a volume of slice locations in which MR data is to be acquired, transmit a notched RF saturation pulse within the selected volume of slice locations, the notched RF saturation pulse having a stop-band between a pair of pass-bands, and acquire MR data in the stop-band of the notched RF saturation pulse.

It has been found that the present invention provides substantial improvement in SNR and contrast to provide better visualization of perfusion defects in MR contrast perfusion scans while simultaneously providing blood pool suppression. Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
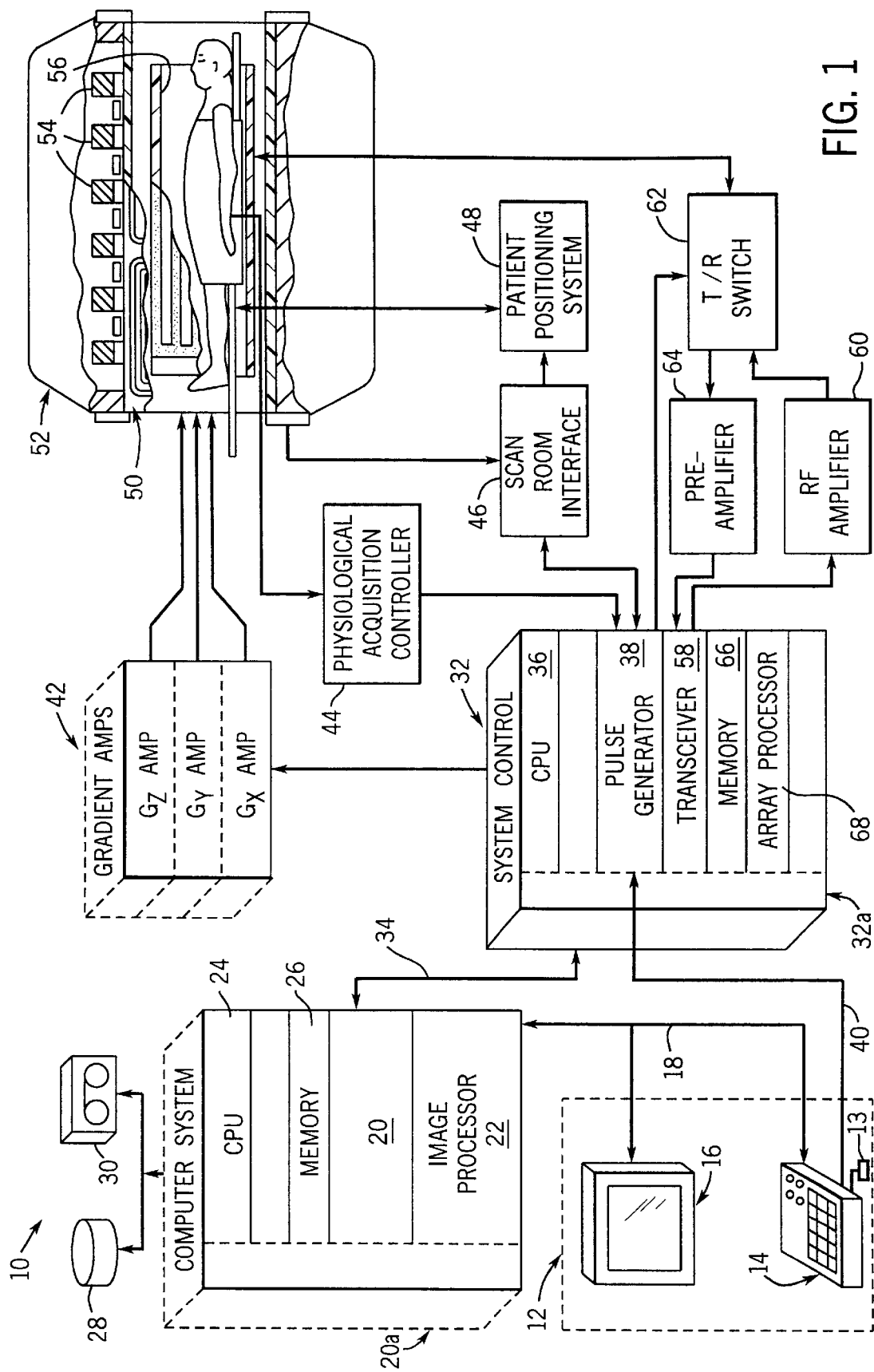
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar such device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding gradient coil in an assembly generally designated 50 to produce the magnetic field gradients used for position encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals radiated by the excited nuclei in the patient may be sensed by the same RF coil 56 and coupled through the transmit/receive switch 62 to a preamplifier 64. The amplified NMR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The NMR signals picked up by the RF coil 56 are digitized by the transceiver module 58 and transferred to a memory module 66 in the system control 32. When a scan is completed, an array of raw k-space data has been acquired in the memory module 66.

As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced NMR system, or any similar or equivalent system for obtaining MR images.

Figure 2:
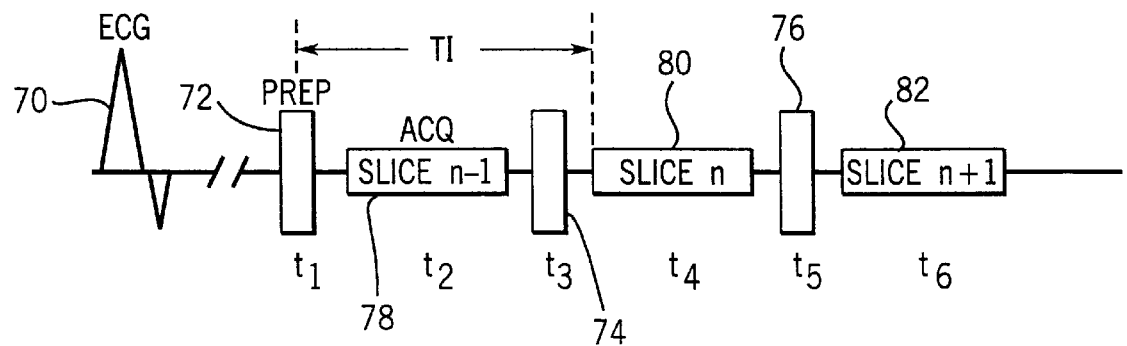
FIG. 2 is a diagram of a pulse-acquisition sequence according to the present invention.

Referring now to FIG. 2, a pulse/acquisition sequence is shown according to the present invention. As indicated, the sequence is gated to an ECG signal 70. As will be described, in order to maintain a high number of slice locations that can be acquired within an R-R interval, the presaturation RF pulses must be slice selective and, preferably, the acquisitions interleaved. There are there are two types of interleaving. The first is interleaving of the preparation pulses and data acquisitions, as demonstrated in FIG. 2 (i.e., prep, acq, prep, acq . . . ). The second involves an interleaving of the slice acquisitions, as in acquiring data from every other slice, or every third slice, or some other such variation, as will be further discussed.

Figure 3:
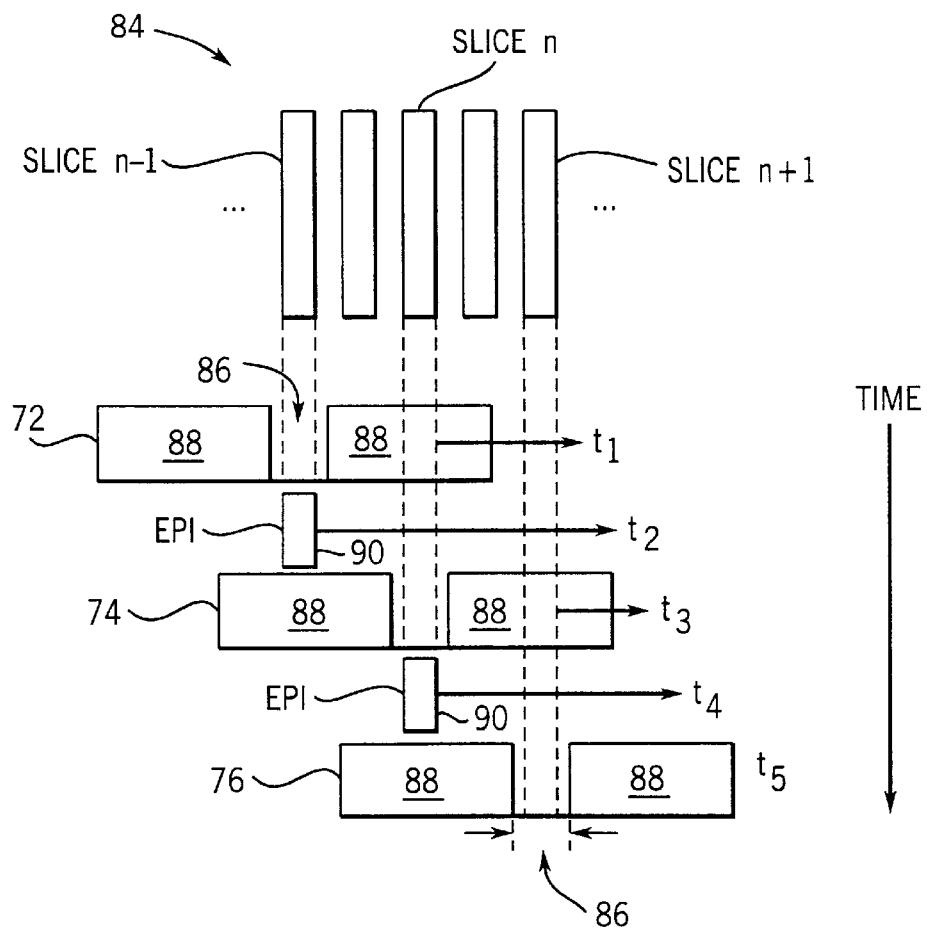
FIG. 3 is a diagram showing a spatial relationship of the pulse-acquisition sequence of FIG. 2.

As shown in FIG. 2, each RF (prep) pulse 72, 74, 76, occurring at times $t_1$, $t_3$ and $t_5$, respectively, is followed by an MR data acquisition 78, 80, and 82, at times $t_2$, $t_4$, and $t_6$, respectively. It is understood that each prep pulse includes a dephasing or spoiling gradient. Each data acquisition 90 follows an RF saturation pulse, but in order to attain a longer TI time, a notched RF saturation pulse is used, as best shown in FIG. 3, wherein the profiles of the saturation pulses 72, 74, and 76 are shown spatially with respect to a plurality of slice locations 84. Each of the saturation pulses 72–76 have a stop-band 86 between a pair of pass-bands 88 so that the spins of the next slice location to be scanned are located within the stop-band of the pulse and are unaffected by the RF saturation pulse. However, spins within the pass-bands 88 are effectively saturated, which is the converse of a conventional RF excitation pulse. The magnetization of the spins within the immediate slice are not perturbed and only the spins that are outside the slice location experience this saturation pulse. Image acquisition of the next slice will not commence until after the next notched RF pulse is transmitted. The spins in the next slice will have recovered for a time TI, FIG. 2, equivalent to the time of an image acquisition segment.

The present invention contemplates interleaving of the presaturation RF pulses, while providing saturation of blood over a large volume outside of a slice thickness defined by the size of the stop-band 86, FIG. 3. Such advantages allow for the use a 90° flip angle for the presaturation RF pulse for maximum dynamic range of contrast enhancement and results in minimizing the effects of arrhythmias and other variations in the patient's heart rate because the magnetization is allowed to recover for a fixed period, as defined by the TI time from a state where the longitudinal magnetization is zero.

Since each given slice is prepared before the acquisition of the preceding slice, the first and first slice in the sequence represents a special case. The first slice of the first phase has no preparation. In the example of FIG. 3, although it is understood that FIG. 3 demonstrates a portion of the sequence in the middle of the sequence, if slice n–1 were the first slice in the first phase of the imaging, it would have no corresponding preparation pulse. Subsequent phases of the first slice, however, are prepared by the saturation pulse that preceded the last slice of the previous phase. That is, slice 1 of phase 2 is saturated by the preparation pulse preceding the last slice of phase 1. Consequently, the time between the preparation and acquisition of the first slice should span an ECG trigger. The TI for the first slice is therefore longer than that of the other slices and is also variable, depending on the R-R interval of the particular heart beat.

Using a notched saturation pulse as shown in FIG. 3, with a flip angle of 90°, results in a net longitudinal magnetization of zero. This results in only low intensity signals of surrounding blood that flows into the slice location of interest. In other words, the pass-bands 88 will block out blood behind and in front of each slice so that the acquisition 90 is accomplished with blood pool suppression.

In the preparation scheme shown in FIG. 3, slice n is saturated by the preparation pulse 72 at time $t_1$ that precedes the EPI acquisition 90 at time $t_2$ of slice n–1. Slice n is subsequently unaffected by the preparation pulse 74 at time $t_3$ that immediately precedes its acquisition 90 at $t_4$.

Therefore, the time between the preparation of each slice and the acquisition of that slice is the effective TI. In this case, TI is $t_4-t_1$. In the preferred embodiment, the slices are acquired in an interleaved manner, rather than sequentially, to allow a wider notch, or stop-band 86, to compensate for potential cardiac motion between saturation in readout. The slices are so labeled to reflect the actual temporal order of the interleaved slices.

In a preferred embodiment, the width of notch 86 is a user selectable parameter,>which may be input through input device 13, FIG. 1. Ideally, the width of notch 86, FIG. 3, should be greater than the image slice thickness sought. The pass-bands 88, on either side of the notch 86, are fixed at approximately five times the width of notch 86 in the preferred embodiment. This is so because when the slices are interleaved (i.e., acquired in the following order: 1,3,5, 7,2,4,6), there is a space of 5 slice thicknesses between the acquisitions of slices 7 and 2. However, in general, the width requirement is that the pass-band be wide enough such that it covers the distance between current slice and the next slice. Since the overall width of the selected volume is typically greater than 150 mm., the RF pulse is 15 ms. in duration and is played out in the presence of a low slice-select gradient. A gradient crusher is then used to dephase the resulting transverse magnetization. The total duration of the preparation sequence is about 18 ms., which is approximately the same length as the preparation sequence of comparable conventional inversion recovery pulse sequence segments, which includes a 5 ms. RF pulse followed by a 10 ms. recovery time.

The myocardium perfusion testing done under both stress and rest conditions was performed on a series of patients using FASTCARD-ET™ pulse sequence (fast segmented k-space gradient echo acquisition with a short echo train length echo planar imaging readout) with the following parameters: ECG-triggering; TR 5.6 ms; TE 1.3 ms; flip angle 25°; echotrain length (ETL) 4; FOV 36×27 cm; slice thickness 10 mm; 0–2 mm spacing; 7 slices acquired over 2 heartbeats; bandwidth ±125 kHz; matrix 128×128 (96 ky lines); notch width 15 mm (1.5 times the slice thickness); overall saturation slab width 165 mm; 0.1 mmol/kg Gd contrast. With an acquisition time for each image equal to 136 ms, the TI was 165 ms. FASTCARD-ET™ is a trademark of the General Electric Company.

It is noted that the acquisition of 3–4 slices per heartbeat is specific for the chosen imaging parameters and for a heartbeat of less that about 100 beats per minute. To be more general, this new sequence maximizes the number of acquirable slices no matter what the imaging parameters and heart rate are because, unlike prior art perfusion techniques, there is no dead time added to the sequence for $T_1$ relaxation.

Figure 4:
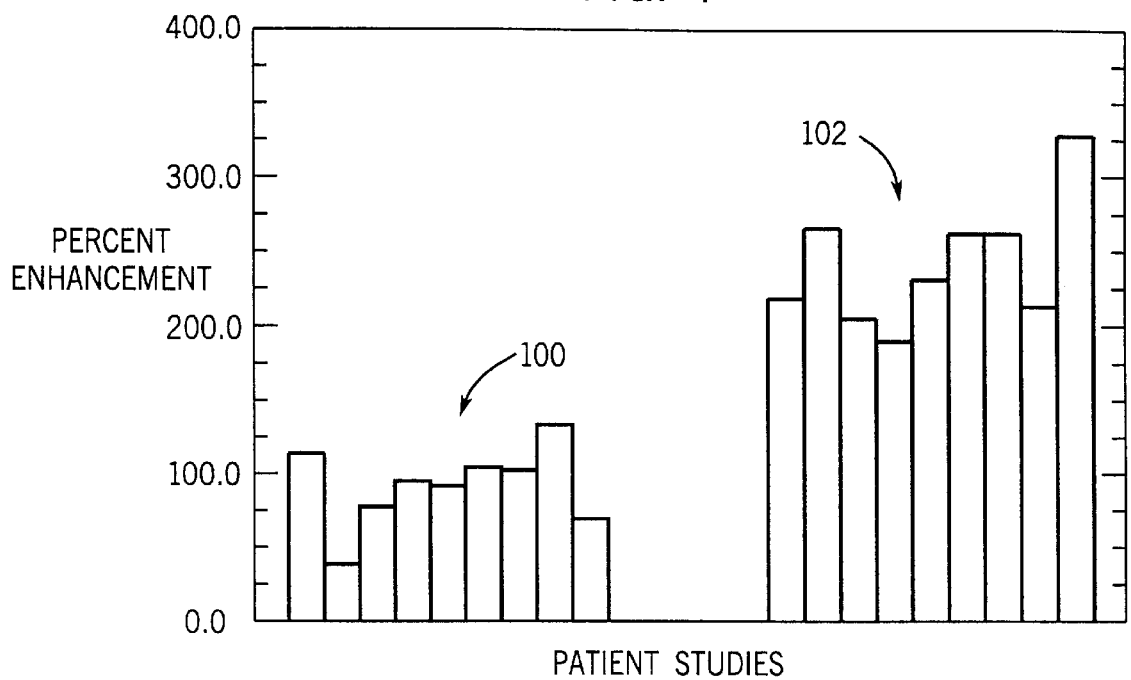
FIG. 4 is a graph showing patient studies versus peak contrast enhancement.

FIG. 4 shows the difference in peak enhancements for several patients between current perfusion sequences 100 and those acquired with the modified sequence of the present invention 102. The average peak enhancements were 92%, with a ±27% variance for the prior art perfusion sequences 100, and 235% with a 31% variance for the present inventive sequence 102.

Figure 5:
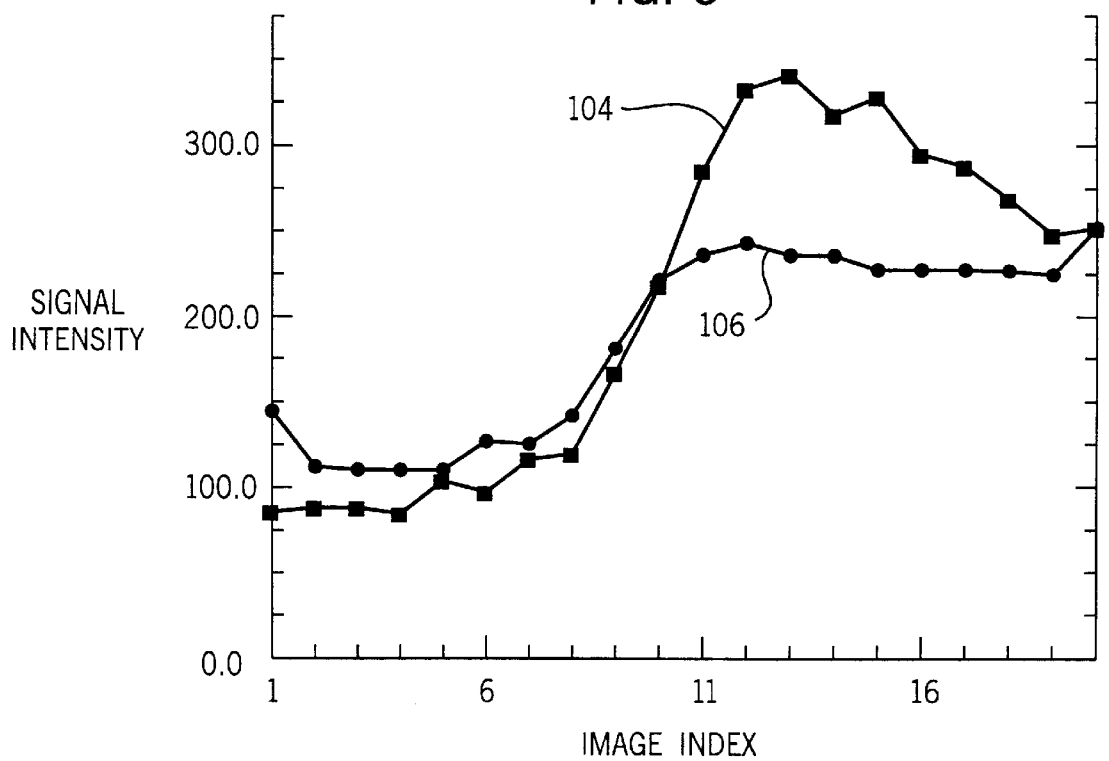
FIG. 5 is a graph showing time-intensity curves of the present invention against a prior art technique.

FIG. 5 shows time-intensity curves for the prior art perfusion sequence 104 and the present invention sequence 106. The inventive sequence 106 exhibits a lower baseline signal, as well as a greater dynamic range than the prior art sequence 104, even with the use of a higher excitation flip angle, such as 25° versus 12°.

Figure 6:
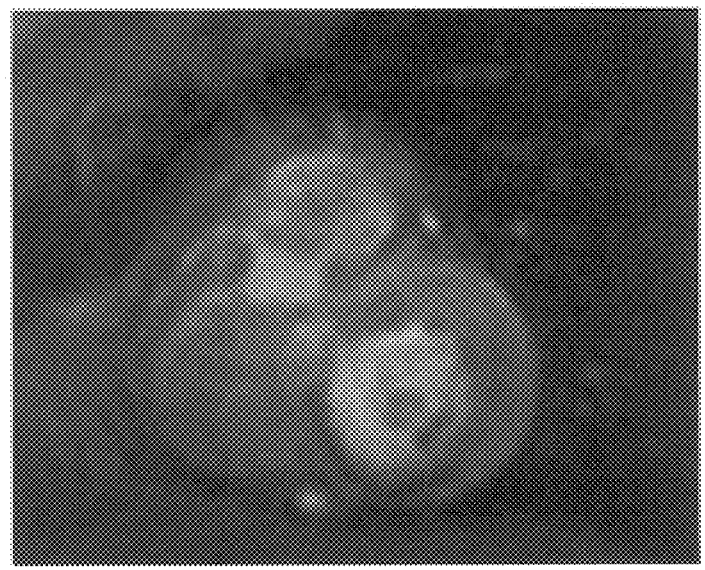
FIG. 6 is a stress image of an implementation of the present invention.
Figure 7:
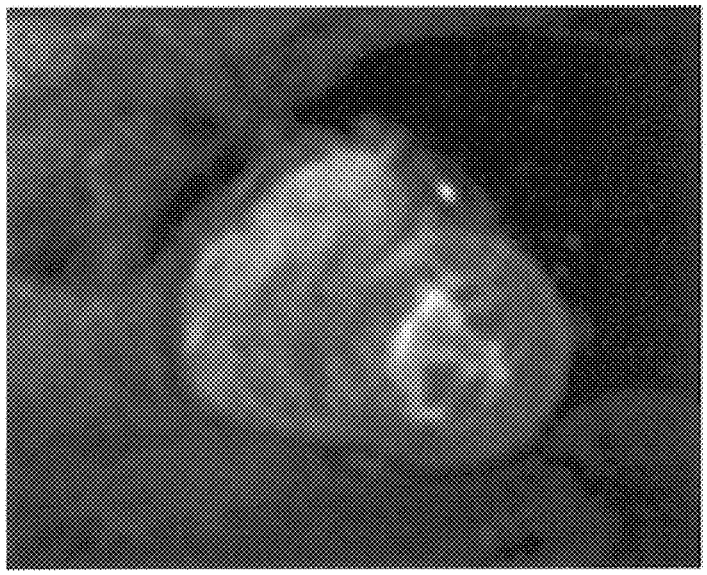
FIG. 7 is a rest image of an implementation of the present invention.

FIGS. 6 and 7 show actual results of a myocardial perfusion MRI. FIG. 6 shows a stress image of the same nominal slice location of a patient acquired with the perfusion sequence of the present invention. FIG. 7 shows that same nominal slice location in a rest image. The images show substantial improvement in SNR and contrast, which permits better visualization of perfusion defects. The regions of perfusion deficits are indicated by a dark circular arc on the lower portion of the left ventricular in the myocardium on the stress image and indicate blood flow failure under stress conditions. The absence of a similar dark spot in the rest image indicates that the tissue is still alive, and the severe contrast between the two images clearly indicates to the physician the specific locations of the deficits.

The use of an interleaved notched preparation pulse according to the present invention is ideal to fulfill the requirements of perfusion MRI. A 90° saturation angle provides immunity to arrhythmias and allows for the development of better T, weighting. The effective interleaving of the saturation pulses permits a significantly longer relaxation time TI. These effects combine to substantially improve image SNR and contrast, without sacrificing slice coverage, while providing blood pool suppression. Further improvement in SNR is achieved with the use of a higher excitation flip angle because there is more longitudinal magnetization available due to the longer TI. The flip angle can accordingly be increased from approximately 12° to 25° and the contrast concentration can be reduced from 0.15 mmol/kg to 0.1 mmol/kg. However, increasing the flip angle too far can result in an unsteady state having highly variable k-space weighting that can increase the amplitude of side lobes in the acquisition point spread function. This has the effect of increasing ghosting and image blurring artifacts.

Accordingly, the present invention includes a method of acquiring MR data having the steps of selecting a volume of slice locations (n) in which MR data is to be acquired, and then transmitting a series of notched RF saturation pulses into the selected volume of slice locations. The method next includes acquiring MR data for the slice location in the stop-band of the notched RF saturation pulse. The step of transmitting is repeated at least for every other slice location such that a series of notched RF saturation pulses are transmitted and wherein the step of acquiring MR data is further defined as interleaving the acquisitions so as to acquire data from every other slice location during each phase, or pass through. The notched RF saturation pulses are designed to saturate all slice locations in the volume selected, except a slice location in which MR data is to be acquired immediately after the transmission of an RF saturation pulse. Preferably, the notched RF saturation pulse is 90° to minimize signal intensity variations caused by arrhythmias in variations and heart rate. The series of transmitting and acquisition interleaving result in longer TI time while maximizing a number of slice locations.

Preferably, a width of the stop-band of the notched RF saturation pulse is greater than that of a slice location thickness and the width of the notched RF saturation pulse is a user selectable parameter. The pass-band of the notched RF saturation pulse saturates substantially all the volume of slice locations in the selected volume except the slice location in which MR data is to be immediately acquired next in time. The pass-band of the notched RF saturation pulse has a width at least five times that of the stop-band and the series of notched RF saturation pulses substantially saturates all the blood within the volume of slice locations selected for effective myocardial perfusion MR imaging.

The invention also includes a method of acquiring MR data with longer relaxation time (TI) which includes defining a number of slices in a volume of interest for which acquisition of MR data is desired, transmitting a notched RF saturation pulse designed to saturate a next slice and all surrounding tissue in the volume of interest except a current slice, and then acquiring MR data from the current slice. The transmission of a notched RF saturation pulse and the acquisition of MR data is repeated for each slice in the volume of interest wherein the next slice becomes a current slice and another slice becomes the next slice so that the current slice is unaffected by the immediately preceding RF saturation pulse thereby extending the TI.

The invention also includes an MRI apparatus to acquire MR images with increased SNR and contrast in perfusion studies that includes an MRI system having a plurality of gradient coils positioned about a bore of a magnet to impress a polarizing magnetic field and an RF transceiver system, including an RF modulator controlled by a pulse control module to transmit RF signals to an RF coil assembly to acquire MR images. The MRI apparatus includes a computer program to periodically activate the MRI system and acquire a time series of MR images. The computer is programmed to select a volume of slice locations in which MR data is to be acquired, transmit a notched RF saturation pulse within the selected volume of slice locations, wherein the notched RF saturation pulse has a stop-band between a pair of pass-bands, and to acquire MR data in the stop-band area of the notched RF saturation pulse. The system is designed to reconstruct an MR image using the acquired MR data, such that the reconstructed MR image has increased SNR and increased image contrast over those acquired without a notched RF saturation pulse.

The present invention also includes a computer system for use with an MRI apparatus having a computer programmed from a computer readable storage medium having thereon a computer program programmed to select a volume of slice locations in which MR data is to be acquired, transmit a notched RF saturation pulse within the selected volume of slice locations, wherein the notched RF saturation pulse has a stop-band between a pair of pass-bands, and to acquire MR data in the stop-band area of the notched RF saturation pulse.

Although cardiac motion is a concern whenever two slice-selective operations are performed nonconsecutively (i.e., the preparation and acquisition operations), the effects can be minimized. The degree of immunity to cardiac motion is determined by the width of the notch in the saturation pulse of the present invention. The width should be chosen wide enough to allow for some motion of the desired slice within the stop-band, but not so wide that the subsequent slice falls into the stop-band and avoids full saturation. The optimal choice is to have each notch contiguous with the prior one.

The present invention has-been described in terms of the preferred embodiment, and it is recognized that equivalents, alternatives, and modifications, aside from those expressly stated, are possible and within the scope of the appending claims.

What is claimed is:

1. A method of acquiring MR data comprising the steps of:
   selecting a volume of slice locations in which MR data is to be acquired;
   transmitting a notched RF saturation pulse within the selected volume of slice locations, the notched RF saturation pulse having a stop-band between a pair of pass-bands; and
   acquiring MR data for the slice location in the stop-band of the notched RF saturation pulse.

2. The method of claim 1 wherein the step of transmitting is repeated at least for every other slice location such that a series of notched RF saturation pulses are transmitted and wherein the step of acquiring MR data is further defined as interleaving each notched RF saturation pulse with an MR data acquisition.

3. The method of claim 2 wherein the series of transmitting and interleaving result in longer TI time while maximizing a number of slice locations.

4. The method of claim 2 wherein the series of notched RF saturation pulses substantially saturates all blood within the volume of slice locations for effective myocardial perfusion MR imaging.

5. The method of claim 1 wherein the notched RF saturation pulse is designed to saturate all slice locations in the volume of slice locations except a slice location in which MR data is to be acquired after the transmission of the notched RF saturation pulse.

6. The method of claim 1 wherein the notched RF saturation pulse is 90° to minimize signal intensity variations caused by arrhythmias and variations in heart rate.

7. The method of claim 1 wherein a width of the stop-band of the notched RF saturation pulse is greater than that of a slice location thickness.

8. The method of claim 1 wherein a width of the notched RF saturation pulse is a user-selectable parameter.

9. The method of claim 1 wherein each pass-band of the notched RF saturation pulse has a width at least 5 times that of the stop-band.

10. The method of claim 1 wherein the pass-bands of the notched RF saturation pulse saturate substantially all the volume of slice locations in the selected volume except a slice location in which MR data is to be acquired next in time.

11. A method of acquiring MR data with longer relaxation time (TI) comprising the steps of:
   (a) defining a plurality of slices in a volume of interest for which MR data acquisition is desired;
   (b) transmitting a notched RF saturation pulse designed to saturate a next slice and all surrounding tissue in the volume of interest except a current slice;
   (c) acquiring MR data from the current slice; and
   (d) repeating steps (b) and (c) for each successive slice in the volume of interest wherein the next slice becomes the current slice and another slice becomes the next slice.

12. The method of claim 11 wherein the notched RF saturation pulse is 90° to minimize signal intensity variations caused by arrhythmias and variations in heart rate.

13. The method of claim 11 wherein the repetitive stops of (b) transmitting and (c) acquiring MR data result in longer TI time while maximizing a number of slice locations.

14. The method of claim 11 wherein the notched RF saturation pulse includes a stop-band and a pass-band and wherein a width of the stop-band of the notched RF saturation pulse is greater than that of a slice location thickness and wherein the pass-band of the notched RF saturation pulse has a width at least 5 times that of the stop-band.

15. The method of claim 14 wherein the pass-band of the notched RF saturation pulse saturate substantially all the volume of slice locations in the volume of interest except a slice location in which MR data is to be acquired next in time and wherein a series of notched RF saturation pulses substantially saturates all blood within the volume of slice locations for effective myocardial perfusion MR imaging.

16. An MRI apparatus to acquire MR images with increased SNR and contrast in perfusion studies comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
- select a volume of slice locations in which MR data is to be acquired;
- transmit a notched RF saturation pulse within the selected volume of slice locations, the notched RF saturation pulse having a stop-band between a pair of pass-bands;
- acquire MR data in the stop-band of the notched RF saturation pulse; and
- reconstruct an MR image using the acquired MR data, such that the reconstructed MR image has increased SNR and increased image contrast over those acquired without a notched RF saturation pulse.

17. The MRI apparatus of claim 16 wherein the computer is further programmed to repeat the transmit step for at least an equal number of times as there are slice locations selected to form a series of transmitted notched RF saturation pulses and wherein MR data is acquired by interleaving MR data acquisitions of the slice locations.

18. The MRI apparatus of claim 17 wherein the series of notched RF saturation pulses substantially saturates all blood within the volume of slice locations for effective myocardial perfusion MR imaging with blood pool suppression.

19. The MRI apparatus of claim 16 wherein the computer is further programmed to select at least 3 slice locations per R-R interval acquisition rate in a perfusion analysis.

20. The MRI apparatus of claim 16 wherein the computer is further programmed to construct the notched RF saturation pulse such that the stop-band has a width greater than a width of a slice location, the pass-bands have a width at least 5 times that of the stop-band, and a flip angle of 90°.

21. The MRI apparatus of claim 16 wherein the computer is further programmed to receive a user-selectable pulse width signal and to construct the notched RF saturation pulse according to a user-selectable pulse width.

22. A computer system for use with an MRI apparatus comprising a computer programmed from a computable readable storage medium having thereon a computer program programmed to:
- select a volume of slice locations in which MR data is to be acquired;
- transmit a notched RF saturation pulse within the selected volume of slice locations, the notched RF saturation pulse having a stop-band between a pair of pass-bands; and
- acquire NM data in the stop-band of the notched RF saturation pulse.

23. The computer system of claim 22 programmed to repeat the transmit step for at least an equal number times as there are slice locations selected to form a series of transmitted notched RF saturation pulses and wherein MR data is acquired by interleaving MR data acquisitions.

24. The computer system of claim 22 programmed to receive a user-selectable pulse width signal and to construct the notched RF saturation pulse according to a user-selectable pulse width and to select at least 3 slice locations per R-R interval acquisition rate in a perfusion analysis.

25. The computer system of claim 22 programmed to construct the notched RF saturation pulse such that the stop-band has a width greater than a width of a slice, the pass-bands have a width at least 5 times that of the stop-band, and a flip angle of 90°.

26. The computer system of claim 22 programmed to repeat the transmit step for at least an equal number times as there are slice locations selected to form a series of transmitted notched RF saturation pulses and wherein MR data is acquired by interleaving the MR data acquisitions and wherein the series of notched RF saturation pulses substantially saturates all blood within the volume of slice locations for effective myocardial perfusion MR imaging and blood pool suppression.

* * * * *

UNITED STATES PATENT AND TRADEMARK OFFICE
CERTIFICATE OF CORRECTION

PATENT NO.    : 6,618,605 B1
DATED         : September 9, 2003
INVENTOR(S)   : Wolff et al.

It is certified that error appears in the above-identified patent and that said Letters Patent is hereby corrected as shown below:

Column 12,
Line 13, delete "NM" and substitute therefor -- MR --.

Signed and Sealed this

Twenty-first Day of October, 2003

JAMES E. ROGAN
*Director of the United States Patent and Trademark Office*